(12) United States Patent
Syzdek et al.

(10) Patent No.: US 7,624,329 B2
(45) Date of Patent: Nov. 24, 2009

(54) PROGRAMMING A MEMORY DEVICE HAVING ERROR CORRECTION LOGIC

(75) Inventors: Ronald J. Syzdek, Austin, TX (US); Timothy J. Strauss, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 579 days.

(21) Appl. No.: 11/468,638

(22) Filed: Aug. 30, 2006

(65) Prior Publication Data

US 2008/0072117 A1 Mar. 20, 2008

(51) Int. Cl.
*G11C 29/00* (2006.01)
(52) U.S. Cl. ..................................... 714/766
(58) Field of Classification Search ............... 714/766, 714/763, 764, 768, 52–54
See application file for complete search history.

(56) References Cited

U.S. PATENT DOCUMENTS

| | | | |
|---|---|---|---|
| 6,611,938 B1 * | 8/2003 | Tanaka et al. ............... | 714/763 |
| 6,760,805 B2 | 7/2004 | Lasser | |
| 7,424,648 B2 * | 9/2008 | Honda .......................... | 714/52 |
| 7,469,368 B2 * | 12/2008 | Chen et al. .................. | 714/710 |
| 2004/0264271 A1 | 12/2004 | Tanzawa et al. | |
| 2005/0243626 A1 | 11/2005 | Ronen | |

* cited by examiner

*Primary Examiner*—Shelly A Chase
(74) *Attorney, Agent, or Firm*—Kim-Marie Vo; Ranjeev Singh

(57) ABSTRACT

Methods and apparatus for programming a non-volatile memory array comprising addressable units are provided. The addressable units are configured to store at least a main portion and an error correction portion. An exemplary method for programming the non-volatile memory array includes, in response to a first condition, switching from an error correction enabled mode to an error correction disabled mode and programming at least the main portion of at least one addressable unit of the non-volatile memory array in the error correction disabled mode. The exemplary method further includes, in response to a second condition, switching from the error correction disabled mode to an error correction fill mode and programming at least the error correction portion of the at least one addressable unit of the non-volatile memory array in the error correction fill mode.

20 Claims, 3 Drawing Sheets

US 7,624,329 B2

PROGRAMMING A MEMORY DEVICE HAVING ERROR CORRECTION LOGIC

FIELD OF THE INVENTION

This invention relates generally to semiconductor devices, and more specifically, to programming a memory device having error correction logic.

BACKGROUND

When testing a semiconductor device, data, such as device configuration data or production test data, may be stored in the nonvolatile memory (NVM) device at various manufacturing or testing stages. Often the data that is stored requires fewer bits than an entire address unit of the NVM's array. However, error correction code (ECC) calculations must be based on an entire address unit. Therefore, to store the test data and use ECC calculations, an entire address unit is used, although some of the address unit is filled with default and meaningless data. Since the entire address unit does not contain meaningful data, all of the memory space is not fully utilized. To be able to store more test data in the NVM device, it is desirable to fully utilize all of the memory space. One solution for utilizing all of the memory space is to not use the ECC calculations. However, this prevents errors from being detected during future reads. Therefore, a need exists for a way to fully utilize the memory space of a NVM device while using ECC calculations.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment, a method and apparatus for programming a memory device having error correction logic involves programming a flash memory device. When programming a flash memory device, the change of state can occur only in one direction (e.g., changing the state of the memory from a logic 1 to a logic 0 state). Thus, once a state is programmed in a flash memory device it can not be changed. Furthermore, for the error correction logic to be used all of the bits (e.g., 64 bits) needs to be filled in an address unit. Thus, f the data to be programmed only needs a portion (e.g., 8 bits) of the total bits (e.g., 64 bits) in an address unit, the additional bits are written and the memory array is not used efficiently. By instead disabling the error correction logic during incremental programming and then later enabling the error correction logic the memory array can be more efficiently used, as discussed in further detail below.

Figure 1:
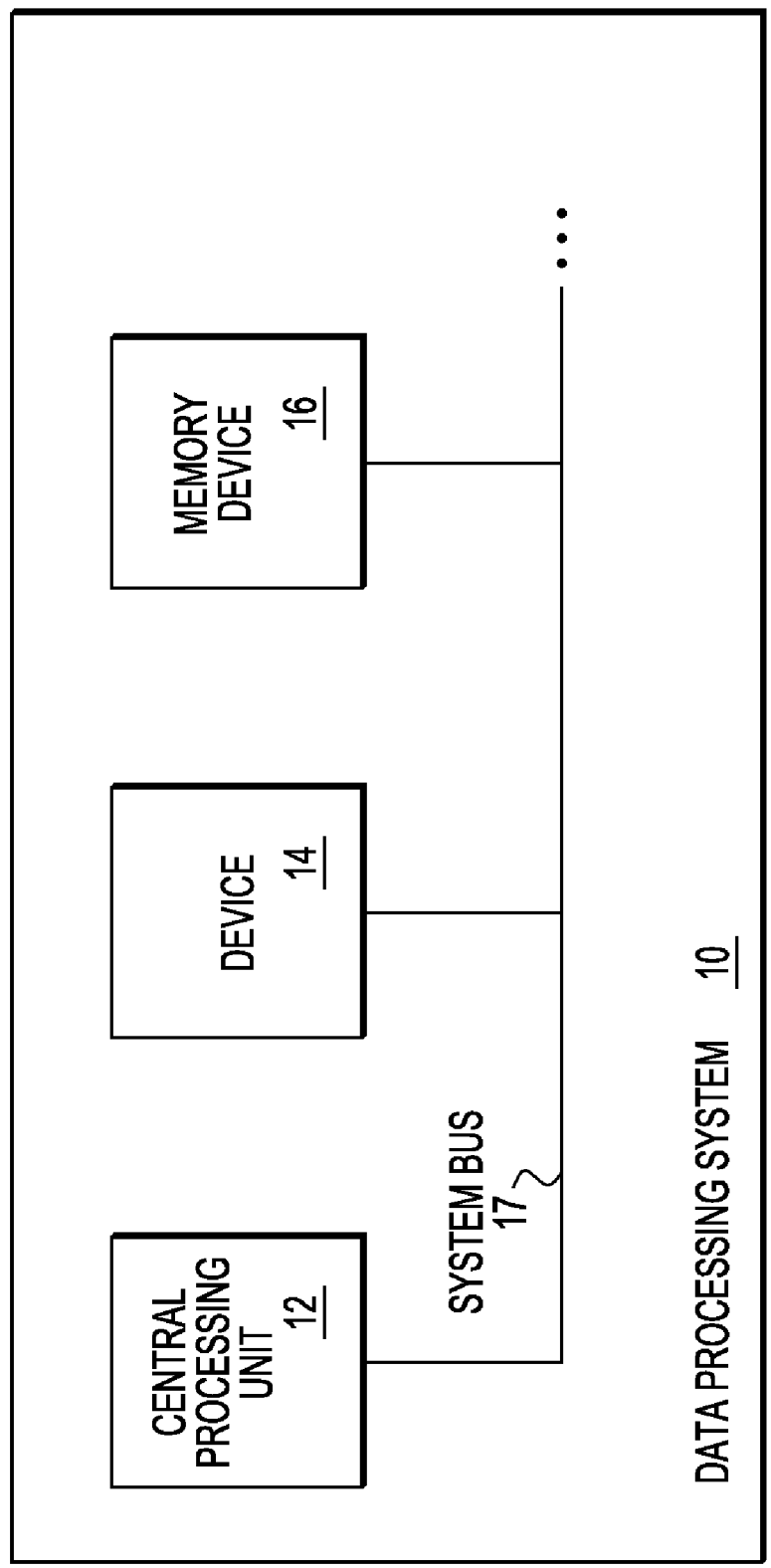
FIG. 1 illustrates a schematic view of a data processing system, such as a microcontroller, in accordance with an embodiment of the present invention.

FIG. 1 illustrates one embodiment of a data processing system 10, which may be a microcontroller. In the embodiment illustrated, the data processing system 10 includes a controller, which may be a processor, which in one embodiment is a central processing unit (CPU) 12, a device 14, which in one embodiment is a memory device (e.g., a static random access memory (SRAM)), and a memory device 16, which in one embodiment is an NVM device, such as a flash memory device. The controller 12 is coupled to the device 14 and NVM device 16 through the system bus 17. The controller 12 may be coupled to additional devices that are not illustrated. In the embodiment illustrated, the NVM device 16 is an embedded NVM device because it is within the microcontroller. In another embodiment (not illustrated), the NVM device 16 can be a stand-alone NVM device such that is not part of the data processing system, such as a microcontroller.

Figure 2:
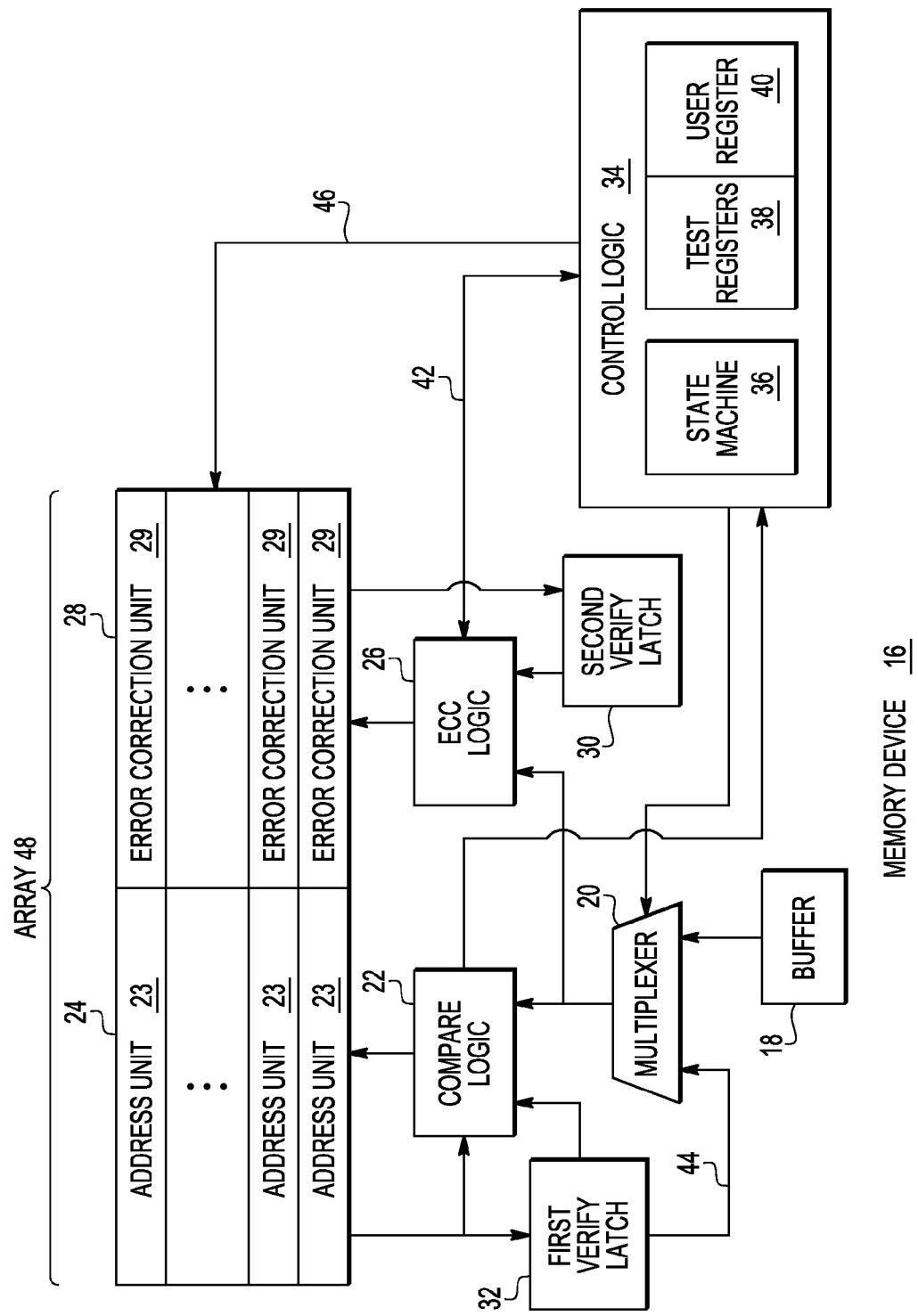
FIG. 2 illustrates a portions of a schematic of an embedded memory device, such as an embedded NVM device, of FIG. 1 or a stand-alone memory device, such as an NVM device, in accordance with embodiments of the present invention.

FIG. 2 illustrates the NVM device 16 (which can be an embedded or a stand-alone NVM device) that will have addressable units programmed within an array 48, such as NVM array 48, for storing data. The NVM array 48 includes a main array 24, which includes address units 23, and an error correction bit array 28, which includes error correction units 29. The address units 23 are a main portion and the error correction units are an error correction portion of addressable units. In one embodiment, the error correction bit array 28 is a parity array 28. The data to be stored in the NVM array 48 can be any data, such as test data supplied during or after a test is performed or user data supplied by a user. In one embodiment the test data, includes production information (e.g., manufacturing lot information, manufacturing location information, trim analog circuit information, data for calibrating the flash, redundancy information, the like, and combinations of the above.) In one embodiment, the user data includes user information (e.g., general data storage, system diary, customer lot information, customer test information.)

The data can be received by the buffer 18 (e.g., program buffer) from the data processing system 10 (such as the controller 12 of the microcontroller) or another suitable source. In other words, the buffer 18 is capable of receiving data for storage in the NVM device 16 (e.g., a main array 24 of the NVM device 16). For example, production test data may be received by the buffer 18. The program test data includes at least one address unit. The buffer 18 may be a program buffer (e.g., a program page buffer or a program double word buffer) or the like. The buffer 18 sends the at least one address unit to the multiplexer 20. The multiplexer 20 has a first input coupled to at least the buffer 18 for receiving data for storage in the address unit 23 of the main array 24. The multiplexer may be coupled to other buffers (not shown). The multiplexer 20 has a second input coupled to the first verify latch 32 and an output coupled to the compare logic 22 and the ECC logic 26. During the ECC disabled mode, the multiplexer 20 sends the at least one address unit to the compare logic 22 but not to ECC logic 26 because the state machine 36 of the control logic 34, prior to the buffer 18 receiving the address unit, has sent a disable signal through the bus 42 to the ECC logic 26 so that the ECC logic 26 is disabled. (FIG. 3 describes the ECC enable mode, which is the mode prior to the ECC disabled mode when the ECC logic 26 is disabled, in more detail.)

The state machine 36 is part of a control logic 34, which includes, in one embodiment, a set of registers, which may include test registers 38 and a user register 40. The state machine 36 may perform a read-verify operation on an address unit 23 in the main array 24, as discussed below. In addition, the state machine 36 may perform a program-verify operation on the error correction units 29 of the error correction bit array 29, as discussed below. In one embodiment, the user register 40 or the test registers 38 are not present. In one embodiment, there is not set of registers and instead is only one register (e.g., a test register 38). The test registers 38 control the NVM device 16 during the test operations. Preferably, the test registers 38 are not accessible by the user. In an embodiment where the test registers 38 are not accessible by the user, if the data input into the buffer 18 is user information, the user register 40 controls the NVM device 16 during operation. If test data is input into the buffer 18, the test registers 38 control the NVM device. One of the test registers 38 or the control register 40 may be modified by the controller 12 based on an event. The event may be a receipt of a test signal from a tester, a receipt of a user signal from a user, a satisfaction of a condition specified by the controller 12, the like, or combinations of the above.

When the compare logic 22 receives the at least one address unit from the buffer 18 it compares it with the address unit stored in a first verify latch 32. The address unit in the first verify latch 32 is data that is received from the main array 24 through a read and verify latch operation. If the compare logic 22 determines the address units are the same, no programming is performed. If the address units are different, then the compare logic 22 sends the determination back to the control logic 34, which will execute a program signal to the multiplexer 20 and cause at least one address unit 23 to be written to the main array 24 by the compare logic 22.

For some technology, module program operations must be performed at 64 bit width such that parity bits may be computed and programmed with the intended data, but the production test data (or other data) may be a smaller increment. For example, fuse information for redundancy repair may only be 8 bits wide. Since ECC logic is disabled, 64 bits widths are not needed and only 8 bits (or any increment) can be written, thereby preventing wasted memory space. Therefore, programming smaller portions of a page (partial page programming) is possible.

As additional data is sent to the buffer 18 the above process is repeated until it is desired to perform ECC fill at which time the ECC logic 26 is enabled. During ECC fill, error correction units 29 are programmed in response to the current state of the address units 23 of the main array 24, as will be discussed below. To enable the ECC logic 26, the NVM device 16 is switched from an ECC disabled mode to an ECC fill mode. The switch may occur in response to a condition that may include detection of a signal (e.g., a control signal) from the controller 12. The user may decide as it is programming when ECC fill is desired. In another embodiment, the time for ECC fill is a predetermined time or event, such as the completions of a test or manufacturing process. Thus, the signal may correspond to an end testing signal. For example, the above programming process can be repeated at various stages of testing a semiconductor device prior to the assembly process and then once, the semiconductor device is assembled a final test can be performed and the end testing signal can be sent from the controller 12. After or while the final test data is programmed, the state machine 36 and bus 42 send an enable signal to the ECC logic 26 to enable the ECC logic and enable the multiplexer 20 to send data to the ECC logic 26.

Once the ECC logic 26 is enabled, the data from the first verify latch 32 is sent to the ECC logic 26 through the multiplexer 20. The ECC logic 26 generates error correction units or bits 29 for storage in the error correction bit array 28 corresponding to the data for programming in the main array 24 and the desired ECC algorithm that is implemented. The ECC logic 26 compares the data from the second verify latch 30 with the data received by the ECC logic 26. (Similar to the first verify latch 32, the second verify latch 30 is a read array that stores data received through a read and latch operation of the error correction bit array 28.) Thus, during this programming process a program-verify operation may be performed on the error correction unit 29 for comparison of the error correction units 29 of the error correction bit array 28 to the main array 24, which may be captured through a read-verify of the main array 24. Thus, during programming of the error correction unit 29, a read-verify operation may be performed on the address unit 23 to capture data to be used by the ECC logic 26 and perform the calculation required for data to be programmed to the error correction bit array 28. The ECC logic 26 communicates its compared results to the control logic 34 via the bus 42. If the data is identical, no programming is performed.

If, instead the data is different, then the control logic 34 sends a signal via the multiplexer 20 so that the ECC logic 26 executes ECC calculations and error correction units 29 are replaced. In one embodiment, a test block corresponding to the nonvolatile memory array 48 is programmed in the error correction fill mode. In this embodiment, the test block includes test data store in the address unit(s) 23 and the error correction unit(s) 29 corresponding to the address unit(s) 23. The address unit(s) 23 may include multiple test data. For example, a first test data may be stored in 6 bits, the second test data may be stored in 8 bits, and so on until the entire address unit(s) 23 is/are filled. This allows for efficient use of the address unit(s) 23 because without the method and apparatus discussed herein the entire address unit (e.g., 64 bits) would need to be filled to store only 6 bit worth of data. Thus, 58 bits are wasted storage space. Instead, here all or some of the 58 bits can be used to store other test data.

Therefore, incremental program writes are performed to the main array 24 while the error correction bit array 28 is ignored. Then, ECC logic 26 is enabled and an ECC fill is executed. For example, this can be when a production test or series of tests is complete. In another embodiment, only a portion of a test may be complete when the ECC logic 26 is enabled. When the ECC logic is enabled the state machine 36 reads array data, computes error correction units 29 and reprograms the error correction bit array 29, which is part of an address unit that also includes address unit 23, with appropriate data. The appropriate data includes 0's or 1's depending on the ECC calculation. Thus an address unit with ECC data is stored.

Figure 3:
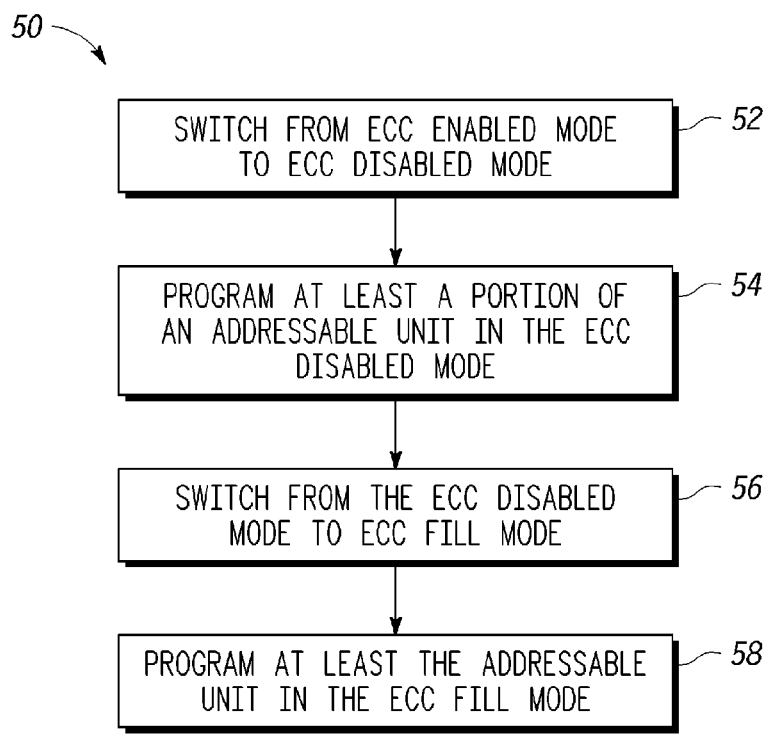
FIG. 3 illustrates the semiconductor substrate of flow in accordance with an embodiment of the present invention.

FIG. 3 illustrates a flow 50 in accordance with one embodiment of the present invention. At first the NVM device is an ECC enabled mode (error correct enabled mode). During the ECC enabled mode, data can be stored. A read-verify operation may occur during the ECC enable mode. If a read-verify operation occurs in the ECC enabled mode it may occur at a higher voltage than a read-verify operation that may occur during the error correction fill mode. (In other words, the read-verify operation on the error correction units 29 during the error correction fill mode is performed at a lower voltage than a read-verify operation in the ECC enabled mode.)

In process 52, the NVM device switches from the ECC enabled mode to an ECC disabled mode (error correction disabled mode) in response to a first condition. In the ECC enabled mode the ECC logic 26 is enabled such that the ECC logic 26 may be used to generate an error correction unit 29. But in the ECC disabled mode the ECC logic is disabled so that an error correction unit 29 cannot be generated and error correction units 29 are not programmed. The first condition can be, for example, the beginning of a test or a series of tests.

The first condition may be determined by the test registers 38 or the user register 40 sending a signal to the state machine 36 that causes the NVM device 16 to switch modes. This switch can be performed by the controller 12 sending a signal (e.g., control signal) to the NVM device 14. The signal can be a begin testing signal or user input, for example. The signal will disable the ECC logic 26. The signal can be generated by the controller 12 based on various events, such as a receipt of a test signal from a tester, a receipt of a user signal from a user, and a satisfaction of a signal.

After the NVM device 16 is in the ECC disabled mode, at least a portion of an address unit 23 (or at least a portion of the addressable unit (e.g., the entire or a portion of the address unit 23) is programmed in the ECC disabled mode as illustrated in process 54. As discussed above, this can be performed using the compare logic 22, the state machine 36 and the first verify latch 32. In one embodiment, the at least a portion of the address unit 23 that is programmed is only a few bits of a full address. For example, only 6 bits of a 64 bit address may be written. In another embodiment, at least a portion of the address unit 23 is the entire address unit (e.g., all 64 bits). In yet another embodiment, the at least the portion of the address unit 23 is the entire main array 24.

Process 54 can be repeated until the desired amount of information is programmed into the main array 24. For example, there may be various information that is to be programmed into the main array 24 after various production testing has been performed. The NVM device 16 can be signaled to know when the desired amount of data is programmed by no longer having any input into the buffer 18 or by signals from the control logic 34 received by the tester, test register 38, or user register 40 written by application code.

After a second condition, such as the desired amount of data is programmed into the memory array 24, the NVM device 16 switches from the ECC disabled mode to the ECC fill mode (error correction fill mode), as illustrated in process 56. In an embodiment previously discussed, this is performed by the state machine 36 in the control logic 34. The programming of error correction units 29 during ECC fill mode may be a single address, a page, or selected blocks.

Once in the ECC fill mode, the addressable unit (of which at least a portion was programmed in process 54) is programmed in the ECC fill mode, as illustrated in process 58. One of the embodiments for programming the ECC fill mode is discussed above with respect to FIG. 2.

In one embodiment, a method for programming a non-volatile memory array comprising addressable units, wherein each of the addressable units is configured to store at least a main portion and an error correction portion, includes (i) in response to a first condition, switching from an error correction enabled mode to an error correction disabled mode, wherein in the error correction disabled mode at least one main array bit corresponding to data to be stored in the main portion of at least one addressable unit of the non-volatile memory array is generated and programming at least the main portion of the at least one addressable unit of the non-volatile memory array in the error correction disabled mode; and (ii) in response to a second condition, switching from the error correction disabled mode to an error correction fill mode and programming at least the error correction portion of the at least one addressable unit of the non-volatile memory array in the error correction fill mode.

In one embodiment, a method for programming a non-volatile memory array comprising addressable units, wherein each of the addressable units is configured to store at least a main portion and an error correction portion, the method includes: (i) in response to a first condition, switching from an error correction enabled mode to an error correction disabled mode; (ii) programming at least the main portion of at least one addressable unit of the non-volatile memory array in the error correction disabled mode; (iii) in response to a second condition, switching from the error correction disabled mode to an error correction fill mode; and (iv) programming at least an error correction portion of the at least one addressable unit of the non-volatile memory array in the error correction fill mode. In one embodiment, in the error correction fill mode at least one error correction bit corresponding to data to be stored in the main portion of the at least one addressable unit of the non-volatile memory array is generated.

In one embodiment, an apparatus for programming a non-volatile memory array comprising addressable units, wherein each of the addressable units is configured to store at least a main portion and an error correction portion, the apparatus includes: (i) at least one buffer for receiving data for storage in the main portion of at least one addressable unit; and (ii) an error correction code logic configured to generate error correction bits for storage in the error correction portion corresponding to the data for programming in the main portion, wherein the error correction code logic is enabled or disabled in response to a control signal from a controller coupled to the non-volatile memory array, and wherein the apparatus is configured to operate in an error correction fill mode during which the error correction code logic is enabled such that the error correction code logic is used to generate at least one error correction bit for programming in the error correction portion of the at least one addressable unit.

By now it should be appreciated that there has been provided a method and apparatus for performing incremental writes to memory space while maintaining ECC code features. In other words, the method enables small and variable programming in memories having ECC. These incremental writes are desirable for program operations at finer granularity than ECC data width and are used through production test to store configuration and test data. In addition, these incremental writes allow memory space dedicated to test and configuration data to be maximized. After the incremental writes, the ECC portion of the data (e.g., the error correction units 29) can be automatically sensed and programmed once all the programming events are completed. This allows for efficient storage of data. The more efficient storage and ECC correction method can be used for a myriad of information, such as test information, customer uses for small programming events, and possible customer EEPROM (Electrically Erasable Programmable Read-Only Memory) emulation uses. By using the more efficient ECC enabled programming process described, test cost can be reduced if used with test data. For EEPROM emulation uses, a portion of a flash memory is used to emulate an EEPROM device. There are different strategies which can be used for EEPROM emulation, such as setting up a file system which allows different types of tagged data to be saved cumulatively in an arbitrary order. EEPROM emulation reduces the extra cost and added complexity by eliminating an extra EEPROM chip.

In the foregoing specification, the invention has been described with reference to specific embodiments. However, one of ordinary skill in the art appreciates that various modifications and changes can be made without departing from the scope of the present invention as set forth in the claims below. For example, at times one or more addressable units, one or more address units 23 or one or more error correction units 29 are discussed, but a skilled artisan recognizes that in these explanations the number of addressable units, address units 23, or error correction units 29 can be one or more of each unit. When one of the units is discussed, multiple units can be affected and vice versa. Accordingly, the specification and figures are to be regarded in an illustrative rather than a restrictive sense, and all such modifications are intended to be included within the scope of the present invention.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. It should be understood that all circuitry described herein may be implemented either in silicon or another semiconductor material or alternatively by software code representation of silicon or another semiconductor material.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "coupled", as used herein, is defined as connected, although not necessarily directly, and not necessarily mechanically.

What is claimed is:

1. A method for programming a non-volatile memory array comprising addressable units, wherein each of the addressable units is configured to store at least a main portion and an error correction portion, the method comprising:
   in response to a first condition, switching from an error correction enabled mode to an error correction disabled mode, wherein in the error correction disabled mode at least one main array bit corresponding to data to be stored in the main portion of at least one addressable unit of the non-volatile memory array is generated and programming at least the main portion of the at least one addressable unit of the non-volatile memory array in the error correction disabled mode; and
   in response to a second condition, switching from the error correction disabled mode to an error correction fill mode and programming at least the error correction portion of the at least one addressable unit of the non-volatile memory array in the error correction fill mode.

2. The method of claim 1, wherein the first condition comprises a detection of a first control signal from a controller coupled to the non-volatile memory array and wherein the second condition comprises a detection of a second control signal from the controller coupled to the non-volatile memory array.

3. The method of claim 2, wherein the first control signal from the controller corresponds to a begin testing signal and the second control signal from the controller correspond to an end testing signal.

4. The method of claim 3, wherein programming in the error correction fill mode comprises programming at least a test block corresponding to the non-volatile memory array.

5. The method of claim 2, wherein the first control signal is generated by the controller based on an event comprising at least one of:
   a receipt of a test signal from a tester;
   a receipt of a user signal from user; and
   a satisfaction of a condition.

6. The method of claim 1, wherein programming at least the error correction portion of the at least one addressable unit of the non-volatile memory array in the error correction fill mode comprises:
   performing a read-verify operation on the main portion of the at least one addressable unit of the non-volatile memory array; and
   performing a program-verify operation on the error correction portion of the at least one addressable unit of the non-volatile memory array.

7. The method of claim 6 further comprising performing the read-verify operation on the main portion of the at least one addressable unit of the non-volatile memory array at a lower voltage than the program-verify operation in the error correction portion of the at least one addressable unit of the non-volatile memory array.

8. A method for programming a non-volatile memory array comprising addressable units, wherein each of the addressable units is configured to store at least a main portion and an error correction portion, the method comprising:
   in response to a first condition, switching from an error correction enabled mode to an error correction disabled mode;
   programming at least the main portion of at least one addressable unit of the non-volatile memory array in the error correction disabled mode;
   in response to a second condition, switching from the error correction disabled mode to an error correction fill mode; and
   programming at least an error correction portion of the at least one addressable unit of the non-volatile memory array in the error correction fill mode.

9. The method of claim 8, wherein in the error correction fill mode at least one error correction bit corresponding to data to be stored in the main portion of the at least one addressable unit of the non-volatile memory array is generated.

10. The method of claim 8, wherein the first condition comprises a detection of a signal from a controller coupled to the non-volatile memory array.

11. The method of claim 10, wherein the signal from the controller corresponds to a begin testing signal.?).

12. The method of claim 8, wherein the second condition comprises a detection of a signal from a controller coupled to the non-volatile memory array.

13. The method of claim 12, wherein the signal from the controller corresponds to an end testing signal.

14. The method of claim 8, wherein programming at least the error correction portion of the at least one addressable unit of the non-volatile memory in the error correction fill mode comprises:
   performing a read-verify operation on the main portion of the at least one addressable unit of the non-volatile memory array; and
   performing a program-verify operation on the error correction portion of the at least one addressable unit of the non-volatile memory array.

15. The method of claim 14, wherein performing the read-verify operation on the main portion of the at least one addressable unit of the non-volatile memory array comprises performing the read-verify operation at a lower voltage than a read-verify operation in the error correction enabled mode.

16. An apparatus for programming a non-volatile memory array comprising addressable units, wherein each of the addressable units is configured to store at least a main portion and an error correction portion, the apparatus comprising:

at least one buffer for receiving data for storage in the main portion of at least one addressable unit; and an error correction code logic configured to generate error correction bits for storage in the error correction portion corresponding to the data for programming in the main portion, wherein the error correction code logic is enabled or disabled in response to a control signal from a controller coupled to the non-volatile memory array, and wherein the apparatus is configured to operate in an error correction fill mode during which the error correction code logic is enabled such that the error correction code logic is used to generate at least one error correction bit for programming in the error correction portion of the at least one addressable unit.

17. The apparatus of claim 16 further comprising:

at least a first verify latch for storing data read from the main portion of the at least one addressable unit;

at least a second verify-latch for storing data read from the error correction portion of the at least one addressable unit; and a multiplexer having a first input coupled to the at least one buffer for receiving data for storage in the main portion of the at least one addressable unit and a second input coupled to the at least the first verify latch and an output coupled to a compare logic and the error correction code logic.

18. The apparatus of claim 17 further comprising a state machine for:

performing a read-verify operation on the main portion of the at least one addressable unit of the non-volatile memory array; and performing a program-verify operation on the error correction portion of the at least one addressable unit of the non-volatile memory array.

19. The apparatus of claim 17 further comprising a set of registers for controlling a state of the control signal, the set of registers comprising at least one test register and at least one user control register.

20. The apparatus of claim 19, wherein a state of the at least one test register and a state of the at least one user control register is modified by the controller based on an event comprising at least one of:

a receipt of a test signal from a tester;

a receipt of a user signal from user; and a satisfaction of a condition specified by the controller.

* * * * *